United States Patent
Wang et al.

(10) Patent No.: US 10,386,982 B2
(45) Date of Patent: *Aug. 20, 2019

(54) ELECTROSTATIC SENSING DEVICE

(71) Applicants: Tsinghua University, Beijing (CN);
HON HAI PRECISION INDUSTRY CO., LTD., New Taipei (TW)

(72) Inventors: Xin-He Wang, Beijing (CN); Dong-Qi Li, Beijing (CN); Jiang-Tao Wang, Beijing (CN); Wen-Yun Wu, Beijing (CN); Yu-Jun He, Beijing (CN); Peng Liu, Beijing (CN); Qing-Yu Zhao, Beijing (CN); Kai-Li Jiang, Beijing (CN); Shou-Shan Fan, Beijing (CN)

(73) Assignees: Tsinghua University, Beijing (CN);
HON HAI PRECISION INDUSTRY CO., LTD., New Taipei (TW)

(*) Notice: Subject to any disclaimer, the term of this patent is extended or adjusted under 35 U.S.C. 154(b) by 261 days.

This patent is subject to a terminal disclaimer.

(21) Appl. No.: 14/983,608

(22) Filed: Dec. 30, 2015

(65) Prior Publication Data
US 2016/0188054 A1     Jun. 30, 2016

(30) Foreign Application Priority Data
Dec. 31, 2014  (CN) .......................... 2014 1 0851148

(51) Int. Cl.
*G06F 3/045* (2006.01)
*G06F 3/041* (2006.01)
(Continued)

(52) U.S. Cl.
CPC .............. *G06F 3/045* (2013.01); *G06F 3/044* (2013.01); *G06F 3/0416* (2013.01);
(Continued)

(58) Field of Classification Search
CPC . G06F 2203/04101; G06F 2203/04103; G06F 3/0416; G06F 3/044; G06F 3/045; H03K 17/955; H03K 2017/9602
See application file for complete search history.

(56) References Cited

U.S. PATENT DOCUMENTS 8,502,786 B2   8/2013 Jiang et al.
8,614,693 B2   12/2013 King et al.
(Continued)

FOREIGN PATENT DOCUMENTS

CN        1381059         11/2002
CN      101937279 A       1/2011
(Continued)

*Primary Examiner* — Viet D Pham
(74) *Attorney, Agent, or Firm* — ScienBiziP, P.C.

(57) ABSTRACT

An electrostatic sensing device comprises an electrostatic sensing module and a control unit electrically connected to the electrostatic sensing module. The electrostatic sensing module comprises a first electrostatic sensing element comprising opposite ends, and two first electrodes. The two first electrodes are separately located on and electrically connected to the two opposite ends of the first electrostatic sensing element. The first electrostatic sensing element is a single walled carbon nanotube or a few-walled carbon nanotube. The control unit electrically is configured to apply a direct voltage to the first electrostatic sensing element and measure a current/resistance of the first electrostatic sensing element.

10 Claims, 9 Drawing Sheets

(51) Int. Cl.
*G06F 3/044* (2006.01)
*G06F 3/0488* (2013.01)
*H03K 17/955* (2006.01)
*H03K 17/96* (2006.01)

(52) U.S. Cl.
CPC ....... *G06F 3/04883* (2013.01); *H03K 17/955* (2013.01); *G06F 2203/04101* (2013.01); *G06F 2203/04103* (2013.01); *H03K 2017/9602* (2013.01)

(56) References Cited

U.S. PATENT DOCUMENTS

| | | | |
|---|---|---|---|
| 9,323,398 B2 | 4/2016 | Bernstein et al. | |
| 2002/0183207 A1 | 12/2002 | Hjortstam et al. | |
| 2008/0048996 A1* | 2/2008 | Hu | G06F 3/044 345/174 |
| 2009/0153513 A1* | 6/2009 | Liu | G06F 3/044 345/173 |
| 2009/0167711 A1* | 7/2009 | Jiang | G06F 3/0412 345/173 |
| 2010/0328258 A1 | 12/2010 | Cheng et al. | |
| 2011/0304579 A1 | 12/2011 | Feng et al. | |
| 2012/0050180 A1 | 3/2012 | King et al. | |
| 2014/0013865 A1* | 1/2014 | White | G01L 1/14 73/862.626 |
| 2014/0144766 A1* | 5/2014 | Feng | H01H 1/027 200/600 |
| 2014/0145980 A1* | 5/2014 | Feng | G06F 3/044 345/173 |
| 2014/0282239 A1* | 9/2014 | Locker | G06F 3/0482 715/810 |
| 2014/0340590 A1* | 11/2014 | Shih | G06F 3/044 349/12 |

FOREIGN PATENT DOCUMENTS

| | | |
|---|---|---|
| CN | 102236439 A | 11/2011 |
| CN | 101859216 | 1/2012 |
| CN | 102483673 | 5/2012 |
| CN | 103168284 | 6/2013 |
| CN | 103235195 A | 8/2013 |
| TW | I416380 | 11/2013 |
| TW | M478871 | 5/2014 |
| WO | 2014009781 A1 | 1/2014 |

\* cited by examiner

ELECTROSTATIC SENSING DEVICE

CROSS-REFERENCE TO RELATED APPLICATIONS

This application claims all benefits accruing under 35 U.S.C. § 119 from China Patent Application No. 201410851148.6, filed on Dec. 31, 2014, in the China Intellectual Property Office. Disclosures of the above-identified applications are incorporated herein by reference.

FIELD

The present application relates to an electrostatic sensing device.

BACKGROUND

Following the advancement in recent years of various electronic apparatuses, such as mobile phones, car navigation systems and the like, toward high performance and diversification, there has been continuous growth in the number of electronic apparatuses equipped with optically transparent touch panels at the front of their respective display devices (e.g., liquid crystal panels). A user of any such electronic apparatus operates it by pressing or touching the touch panel with a finger, a pen, stylus, or another like tool while visually observing the display device through the touch panel. Therefore, a demand exists for touch panels that provide superior visibility and reliable operation.

With the rapid development of electronic apparatuses, some touch panels need to also recognize a hover event, i.e., an object (hand or touch pen) near but not touching the touch panel, and the position of the hover event at the touch panel. However, a sending device being used to recognize the hover event via electrostatic sensing was not reported yet.

What is needed, therefore, is to provide an electrostatic sensing device and method for recognizing the hover event via electrostatic sensing.

BRIEF DESCRIPTION OF THE DRAWINGS

Implementations of the present technology will now be described, by way of example only, with reference to the attached figures, wherein.

DETAILED DESCRIPTION

Figure 1:
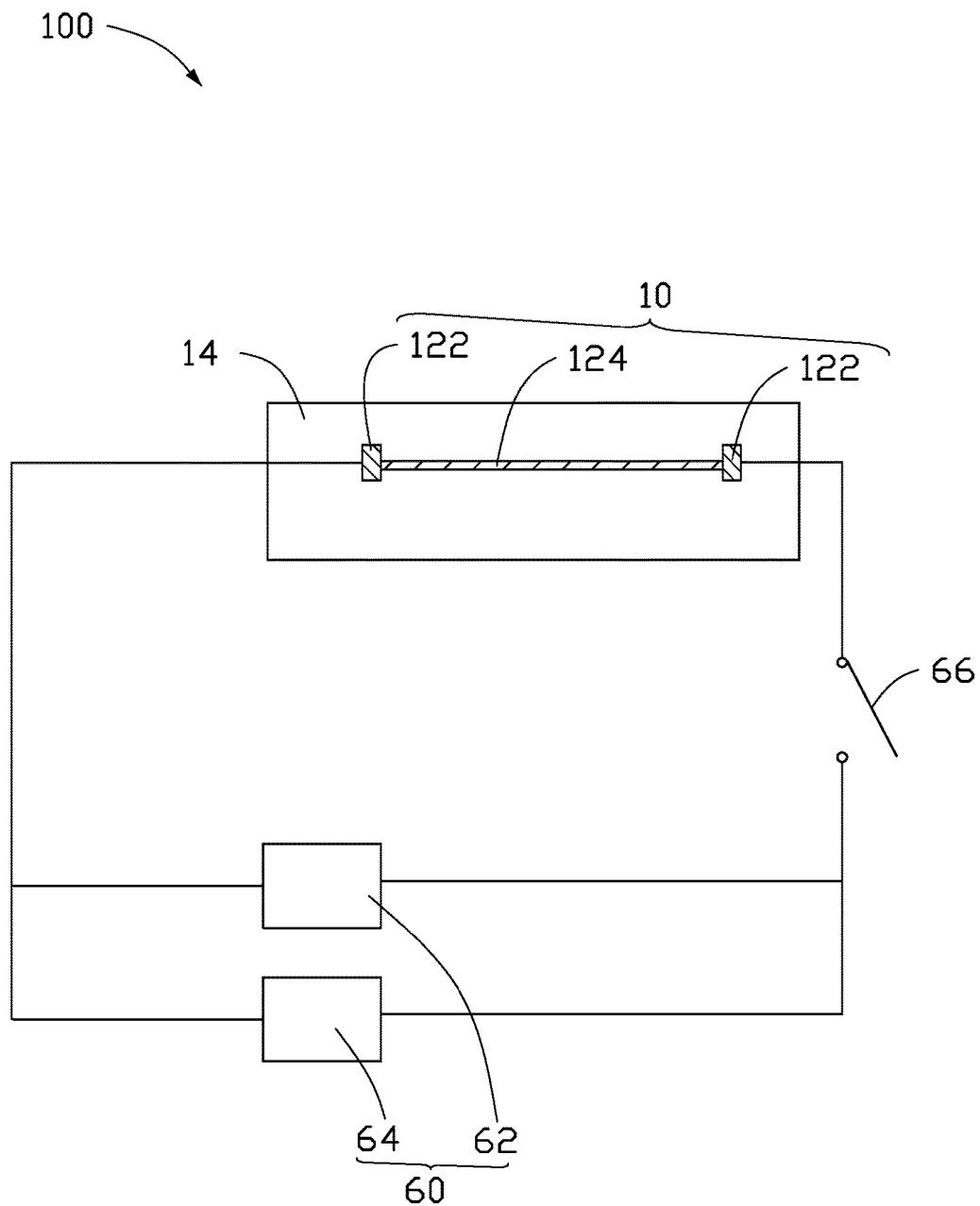
FIG. 1 is a schematic view of one embodiment of an electrostatic sensing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, an electrostatic sensing device 100 according to one embodiment comprises an electrostatic sensing module 10 and a control unit 60 electrically connected to the electrostatic sensing module 10.

The electrostatic sensing module 10 comprises a substrate 14, a first electrostatic sensing element 124 having two opposite ends, and two first electrodes 122. The first electrostatic sensing element 124 and the two first electrodes 122 are located on a surface of the substrate 14. The two first electrodes 122 are separately located on and electrically connected to the two opposite ends of the first electrostatic sensing element 124. The two first electrodes 122 are electrically connected to the control unit 60 via conductive wire.

The substrate 14 can be flat or curved to support other elements. The substrate 14 can be insulating and transparent. The substrate 14 can be also opaque. The substrate 14 can be made of rigid materials such as glass, quartz, diamond, plastic or any other suitable material. The substrate 14 can also be made of flexible materials such as polycarbonate (PC), polymethyl methacrylate acrylic (PMMA), polyimide (PI), polyethylene terephthalate (PET), polyethylene (PE), polyether polysulfones (PES), polyvinyl polychloride (PVC), benzocyclobutenes (BCB), polyesters, or acrylic resin. A thickness of the substrate 14 can be in a range from about 1 millimeter to about 1 centimeter. A shape and size of the substrate 14 can be selected according to need. In one embodiment, the substrate 14 is a flat quartz plate, the area of the substrate 14 is 2 centimeters×2 centimeters, the thickness of the substrate 14 is 2 millimeters.

The first electrostatic sensing element 124 is fixed on the surface of the substrate 14 via any means. In one embodiment, the first electrostatic sensing element 124 is fixed on the surface of the substrate 14 via an insulating adhesive. The insulating adhesive can be coated on whole surface of the first electrostatic sensing element 124. The insulating adhesive can only be located on portions of the first electrostatic sensing elements 124. The first electrostatic sensing elements 124 can be one-dimensional semiconducting linear structure with single crystal structure. A diameter of the one-dimensional semiconducting linear structure can be less than 100 nanometers. When a sensed object with electrostatic charge near but does not touch the first electrostatic sensing element 124, the resistance of the first electrostatic sensing element 124 can be changed to produce a resistance signal. The sensed object with any static charge can be regarded as the sensed object with electrostatic charge in this disclosure. In some embodiments, a user's finger(s) are as an example of the sensed object with electrostatic charge. The resistance change can be obtained by detecting current change of the first electrostatic sensing element 124.

The one-dimensional semiconducting linear structure can be a semiconducting linear structure with larger length diameter ratio. The length diameter ratio of the one-dimensional semiconducting linear structure is greater than 1000:1.

The one-dimensional semiconducting linear structure can be one semiconducting graphene strip with a width of less than 10 nanometers, a thickness of less than 5 nanometers, and a length of great than 1 centimeter. The one-dimensional semiconducting linear structure can be one semiconducting silicon nanowire with a diameter of less than 5 nanometers, and a length of greater than 1 centimeter. The one-dimensional semiconducting linear structure can be one ultra long single walled carbon nanotube. The ultra long single walled carbon nanotube has a length greater than 1 centimeter, a diameter less than 5 nanometers. The one-dimensional semiconducting linear structure can be a few-walled carbon nanotube with walls of from two layers to six layers. In one embodiment, the few-walled carbon nanotube has two or three layers wall. In one embodiment, the first electrostatic sensing element 124 is a ultra long single walled carbon nanotube has a length about 2 centimeters, a diameter about 2 nanometers.

Figure 2:
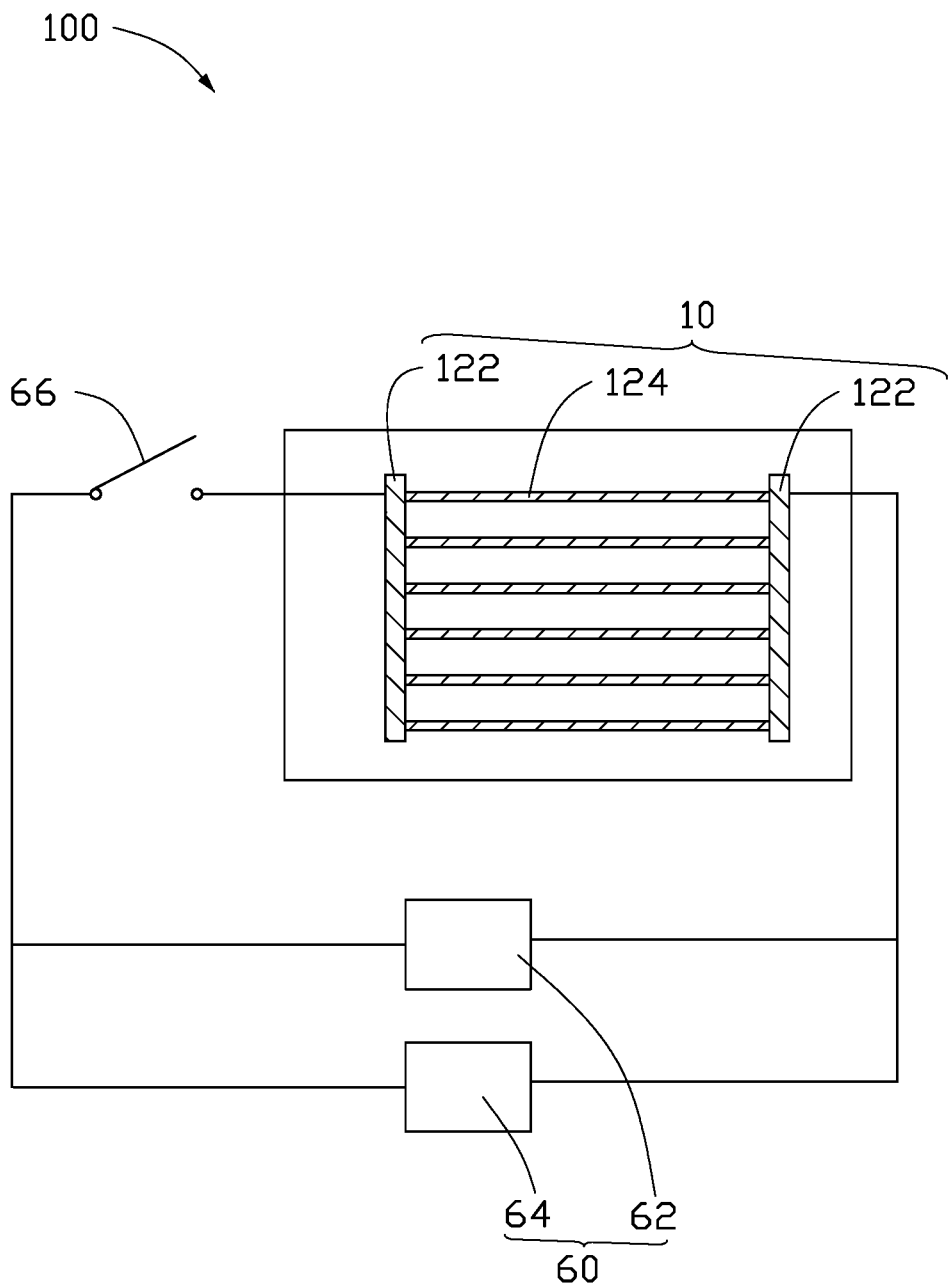
FIG. 2 a schematic view of one embodiment of an electrostatic sensing device.

Referring to FIG. 2, in one embodiment, the electrostatic sensing module 10 can further comprise a plurality of the first electrostatic sensing elements 124 spaced and substantially parallel to each other, located on the surface of the substrate 14. The two opposite ends of each of the plurality of the first electrostatic sensing elements 124 are separately electrically connected together to the two first electrodes 122.

When a sensed object with electrostatic charge is near but does not touch the one-dimensional semiconducting linear structure, the resistance of the one-dimensional semiconducting linear structure can be changed. The sensed object can be recognized by a device because the resistance of the one-dimensional semiconducting linear structure is changed. An electric field generated by static electricity of the sensed object can easily affect Fermi surface moving of the one-dimensional semiconducting linear structure. Electric field outside the one-dimensional semiconducting linear structure would affect Fermi surface movement of the one-dimensional semiconducting linear structure. Conductivity of the one-dimensional semiconducting linear structure significantly changes with the Fermi surface movement of the one-dimensional semiconducting linear structure.

The one-dimensional semiconducting linear structure has excellent response to the electric field of the send object for below reasons. Almost the one-dimensional semiconducting linear structure can not constitute an electric field shielding, and it can be completely regulated by external electric field. While electric field applied on a three-dimensional conductive material can hardly affect internal of the three-dimensional conductive material, because of the three-dimensional conductive material having a strong surface shielding. Due to the quantum confinement effect, the electron density of states (DOS) of one-dimensional material would have many singularities. While the Fermi surface is moving near the singularity, the electron density of states will dramatically changes. The dramatic changes of the electron density of states would lead to the conductivity of the one-dimensional semiconducting linear structure significant changes.

Therefore, electrostatic can modulate the Fermi surface moving in the vicinity of the singularity in the one-dimensional semiconducting linear structure, to get a significant change in the electrical conductivity of the semiconducting linear structure. Therefore, the sensed object with electrostatic charge can be recognized by the one-dimensional semiconducting linear structure when the sensed object is near but does not touch the semiconducting linear structure. In order to realize this sensing static function, the distance between the Fermi surface and the singularity of the one-dimensional semiconducting linear structure should be within a specific range.

Figure 3:
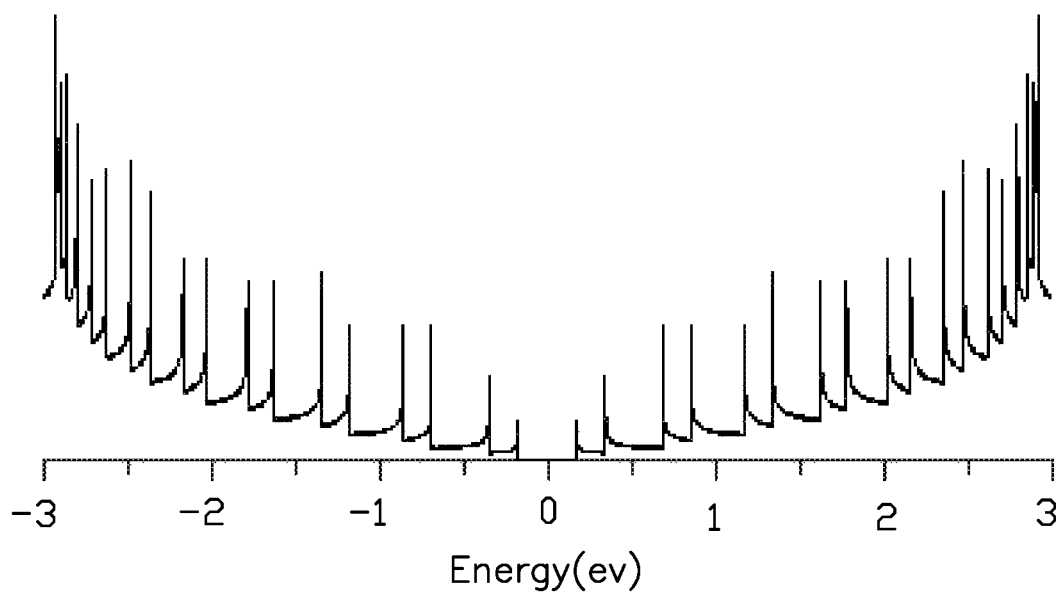
FIG. 3 is an electron density of state distribution curve of carbon nanotube.
Figure 4:
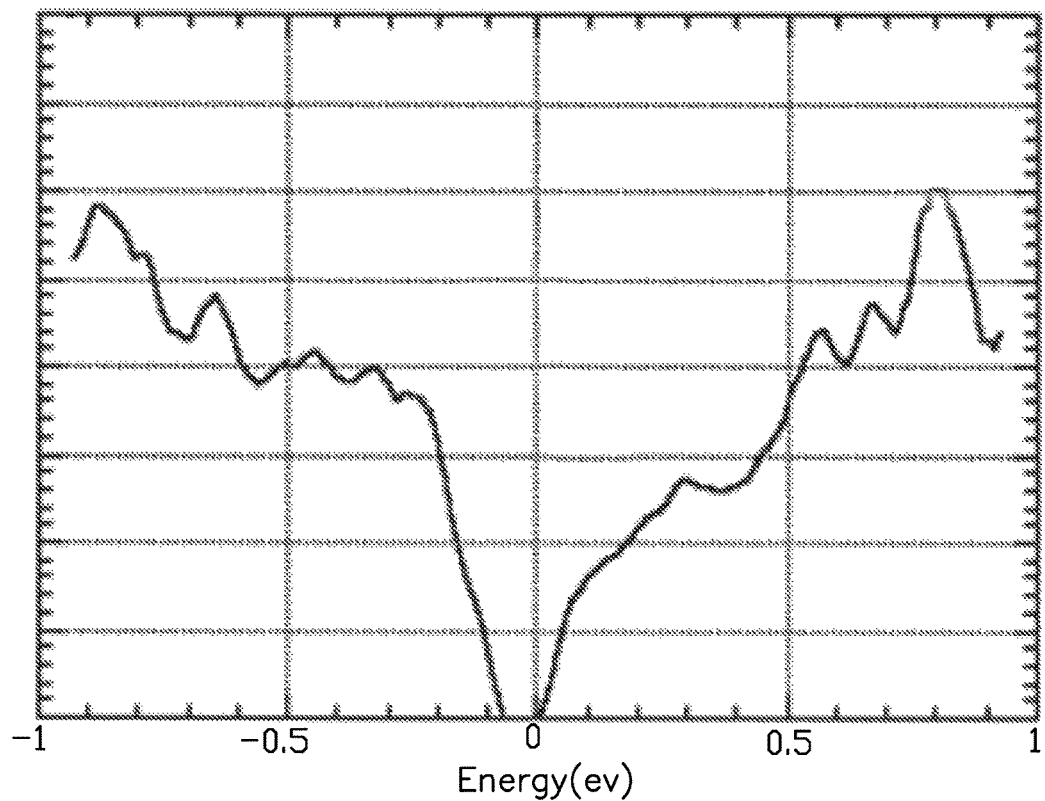
FIG. 4 is an electron density of state distribution curve of carbon nanotube under normal temperature measured by Scanning tunneling spectroscopy (STS).

As shown in FIG. 3, the electron density of states distribution curve of the carbon nanotube have a lot of singularities. The electron density of states of the carbon nanotube takes great value at the point of the singularity. Distribution of singularities is relatively symmetrical to zero energy. In an ideal state without making any doping, the Fermi level locates on 0 eV place. The above properties are all one-dimensional semiconducting linear structure common characteristics. As previously mentioned, a sensitive response to the electrostatic requires Fermi surface moving in the vicinity of the singularity of one-dimensional semiconducting linear structure. So that there is a need to make the Fermi level to raise or decrease to the neighborhood singularity nearest to 0 eV. Referring to FIG. 4, in practice, due to the thermal excitation, surface adsorption and interaction with the surrounding environment, the singularities of one-dimensional semiconducting linear structure will be broadened into a half-height peak with a width L. The peaks are always to be buried because the overlap of the peaks. But, the rising edge of peak singularity nearest 0 eV is always present. To make the one-dimensional semiconducting linear structure having sensitive response to electrostatic, the Fermi surface needs to be fixed at a place with a distance to the singularity less than L/2. In practical applications, to obtain sensitive response to electrostatic, through natural doping or manual doping, to make the energy distance between the Fermi surface and the singularity of the one-dimensional semiconducting linear structure within a range of 30 meV~300 meV.

Carbon nanotubes prepared sample exposed to air, since the formation of oxygen adsorbed p-type doped, the energy distance from the Fermi surface to singular points in the state density falls within 30~300 meV, preferably 60 to fall within 100 meV. Therefore, thereby manual prepared natural carbon nanotubes have a sensitive electrostatic response. Graphene strips, semiconducting nanowires (e.g. silicon nanowires) can adsorb oxygen to form a p-type doping. A doping can also be used to adjust energy distance between the Fermi surface and the singular point in the state density within a distance of 30~300 meV.

When the sensed object with electrostatic charge nears but does not touch the one-dimensional material semiconducting linear structure, the Fermi level of the one-dimensional semiconducting linear structure would be modulated, the corresponding electron density of states will change, and the conductivity will change consequently. Therefore, when considering the sensitivity of the process, it is needed to focus on two things: first, modulation efficiency of the sensed object to the Fermi level of the one-dimensional semiconducting linear structure; second, the change rate of the density of states with the Fermi level moving of the one-dimensional semiconducting linear structure.

With respect to the first point, this is strongly influenced by the substrate material, the surface adsorption and other environmental factors. It is impossible to quantitatively determine the modulation efficiency of the sensed object to the Fermi level of the one-dimensional semiconducting linear structure theoretically. The modulation efficiency of the sensed object to the Fermi level of the one-dimensional semiconducting linear structure can only be obtained from experimental measurements. Silica, for example, a sample of the silica substrate, the modulation efficiency is measured as $4 \times 10^{-5}$. The second point is a requirement about the one-dimensional semiconducting linear structure, which requires the absolute value of $(d\sigma/dE_F)/(\sigma/E_F)$ greater than $10^{-1}$, or greater than $10^{-3}$ ($\sigma$ is the conductivity of the one-dimensional semiconducting linear structure, $E_F$ is the Fermi surface location of the one-dimensional semiconducting linear structure). In this condition, when the sensed objection is close to the one-dimensional semiconducting linear structure, the conductivity change is not less than 10% in favor to signal detection.

When using carbon nanotubes with the diameter distribution of 2-3 nm (carbon nanotubes are located on a silica substrate), the conductivity of the carbon nanotubes reduce by half ($d\sigma/\sigma \sim \frac{1}{2}$), when a sensed object with electrostatic charge 1000V is close to the carbon nanotubes at a place 0.5 centimeter far from the carbon nanotubes. The modulation efficiency is measured as $4 \times 10^{-5}$, $dE_F \sim 40$ meV. The $E_F$ of the carbon nanotubes is $E_F \sim 150$ meV. Thus, the absolute value of $(d\sigma/dE_F)/(\sigma/E_F)$ of the carbon nanotube is about 2. The graphene strips, the semi-conductive nano-wires can satisfy the requirement of $(d\sigma/dE_F)/(\sigma/E_F)$ is greater than $10^{-1}$, or greater than $10^{-3}$. If it is just to achieve a qualitative sense the presence or absence of the sensed object with static electricity, $(d\sigma/dE_F)/(\sigma/E_F)$ of one-dimensional semiconducting linear structure is greater than $10^{-3}$. If it is to quantify the amount of sensing electrostatic or sense the position of the sensed object with static electricity, $(d\sigma/dE_F)/(\sigma/E_F)$ of one-dimensional semiconducting linear structure is greater than $10^{-1}$.

One single walled carbon nanotube or a single few-walled carbon nanotube is a quasi-one-dimensional structure. The smaller the diameter of the quasi-one-dimensional structure is, the density of states (DOS) of the quasi-one-dimensional structure is greater. The greater the DOS of the quasi-one-dimensional structure is, the shielding effect of the quasi-one-dimensional structure is smaller. The smaller the shielding effect of the quasi-one-dimensional structure is, the sensibility of sensing static electricity of the quasi-one-dimensional structure is greater. Therefore, the smaller the diameter of the single walled carbon nanotube or the few-walled carbon nanotube is, the sensibility of sensing position coordinate of the sensed object is greater.

The diameter of the single walled carbon nanotube or the few-walled carbon nanotube can be less than about 5 nanometers. In one embodiment, the diameter of the single walled carbon nanotube or the few-walled carbon nanotube is in a range from about 2 nanometers to about 5 nanometers. The ultra long single walled carbon nanotube or few-walled carbon nanotube can have a length greater than 1 centimeter. In one embodiment, the first electrostatic sensing element 124 is single walled carbon nanotubes or few-walled carbon nanotubes with diameter of about 2 nanometers and length of about 2 centimeters. The single walled carbon nanotubes or few-walled carbon nanotubes can be made by a known method of adopting a "kite-mechanism". An example of the "kite-mechanism" is disclosed in Publication No. US20130252405A1.

The two first electrodes 122 can be made of a conductive material, such as metal, conductive polymer, conductive adhesive, metallic carbon nanotubes, or indium tin oxide (ITO). The two first electrodes 122 can be made by a method such as screen printing, chemical vapor deposition, or magnetron sputtering. In one embodiment, the material of the two first electrodes 220 is ITO.

The control unit 60 is configured to apply a direct voltage to the first electrostatic sensing element 124 and measure a current/resistance of the first electrostatic sensing element 124. The control unit 60 comprises a circuit control module 62, a resistance measuring module 64 and a switch 66. The circuit control module 62, the resistance measuring module 64 and the switch 66 are electrically connected to the two first electrodes 122. It is understood that, the amount of the switch 66 depends on the amount of the first electrostatic sensing element 124.

A method of sensing electrostatic using the electrostatic sensing device 100, comprises steps of:

S1, providing the electrostatic sensing device 100;

S2, applying a direct voltage to the first electrostatic sensing element 124; and S3, measuring the resistance changed value of the first electrostatic sensing element 124 in response to the sensed object, with electrostatic charge, being near but not making contact with the first electrostatic sensing element 124, wherein a distance between the sensed object and the first electrostatic sensing element 124 is less than 0.5 centimeter.

In step S1, the electrostatic sensing device 100 can be used as a simple switch or electrostatic sensing used as a switch, it can also be used with other electronic components, thereby controlling the opening and closing of the circuit.

In step S2, the circuit control module 62 applies a direct voltage to the first electrostatic sensing element 124. In step S3, the sensed object with electrostatic charge refers to the object itself with an electrostatic charge, which can produce an electrostatic field. The object with any static charge can be regarded as the sensed object with electrostatic charge in this disclosure. In some embodiments, a user's finger(s) are as an example of the sensed object with electrostatic charge.

In step S3, the resistance measuring module 64 can measure the current/resistance of the first electrostatic sensing element 124. A current/resistance changed value of the first electrostatic sensing element 124 is proportional to a distance between the sensed object and the first electrostatic sensing element 124. The smaller the distance between the sensed object and the first electrostatic sensing element 124 is, the current/resistance changed value of the first electrostatic sensing element 124 is greater. The current/resistance changed value can be measured by the resistance measuring module 64.

Furthermore, the electrostatic sensing device 100 can measure the distance between the sensed object and the first electrostatic sensing element 124. According to the resistance changed value of the first electrostatic sensing element 124 when the sensed object nears but does not touch the first electrostatic sensing element 124, the distance between the sensed object and the first electrostatic sensing element 124 can be measured. In application, a threshold value of the resistance changed value can be set. The threshold value of the resistance changed value corresponds to a setting threshold distance between the sensed object and the first electrostatic sensing element 124. Therefore, when the sensed object is moved to the place which meets the setting threshold distance from the first electrostatic sensing element 124, the electrostatic sensing device 100 would send a signal which enables a function of switches. Further, the threshold value of the resistance changed value can be used to control the impact of noise, such as static interference outside. Only when the resistance changed value of the first electrostatic sensing element 124 reaches the threshold, the electrostatic sensing device 100 will send a signal to achieve function.

Figure 5:
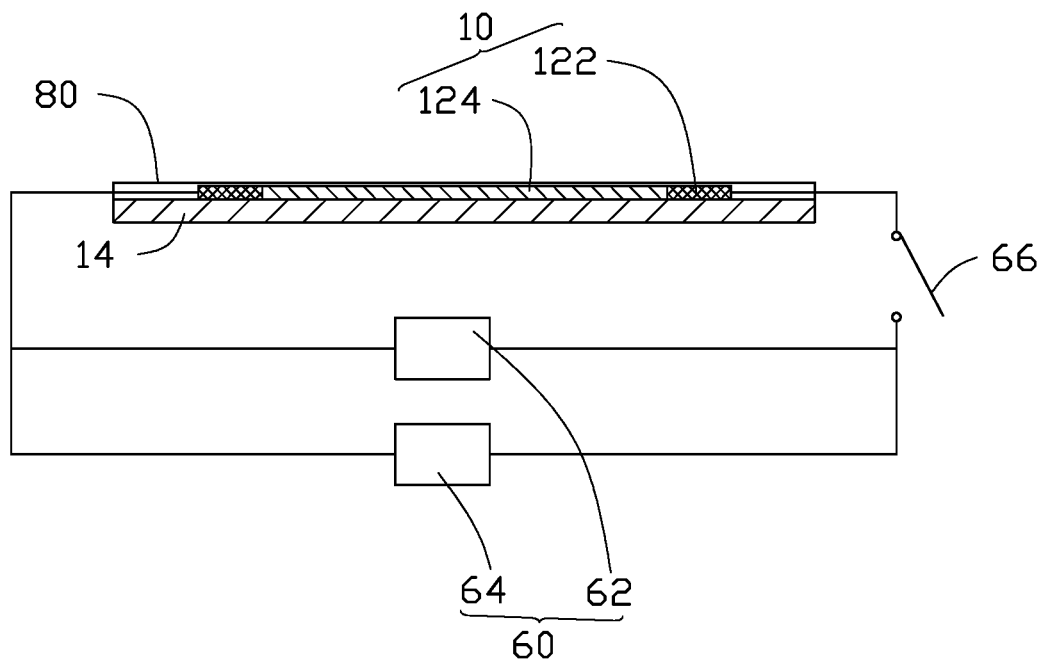
FIG. 5 is a side view of the electrostatic sensing device of FIG. 1.

Referring to FIG. 5, the electrostatic sensing device 100 can further comprise an insulating protecting layer 80 located on the substrate 14 to protect the electrostatic sensing module 10. The first electrostatic sensing element 124 and the first electrode 122 are covered by the insulating protecting layer 80. The material of the insulating protecting layer 80 is insulating and transparent, such as polyethylene (PE), polycarbonate (PC), polyethylene terephthalate (PET), polymethyl methacrylate acrylic (PMMA), or thin glass.

Figure 6:
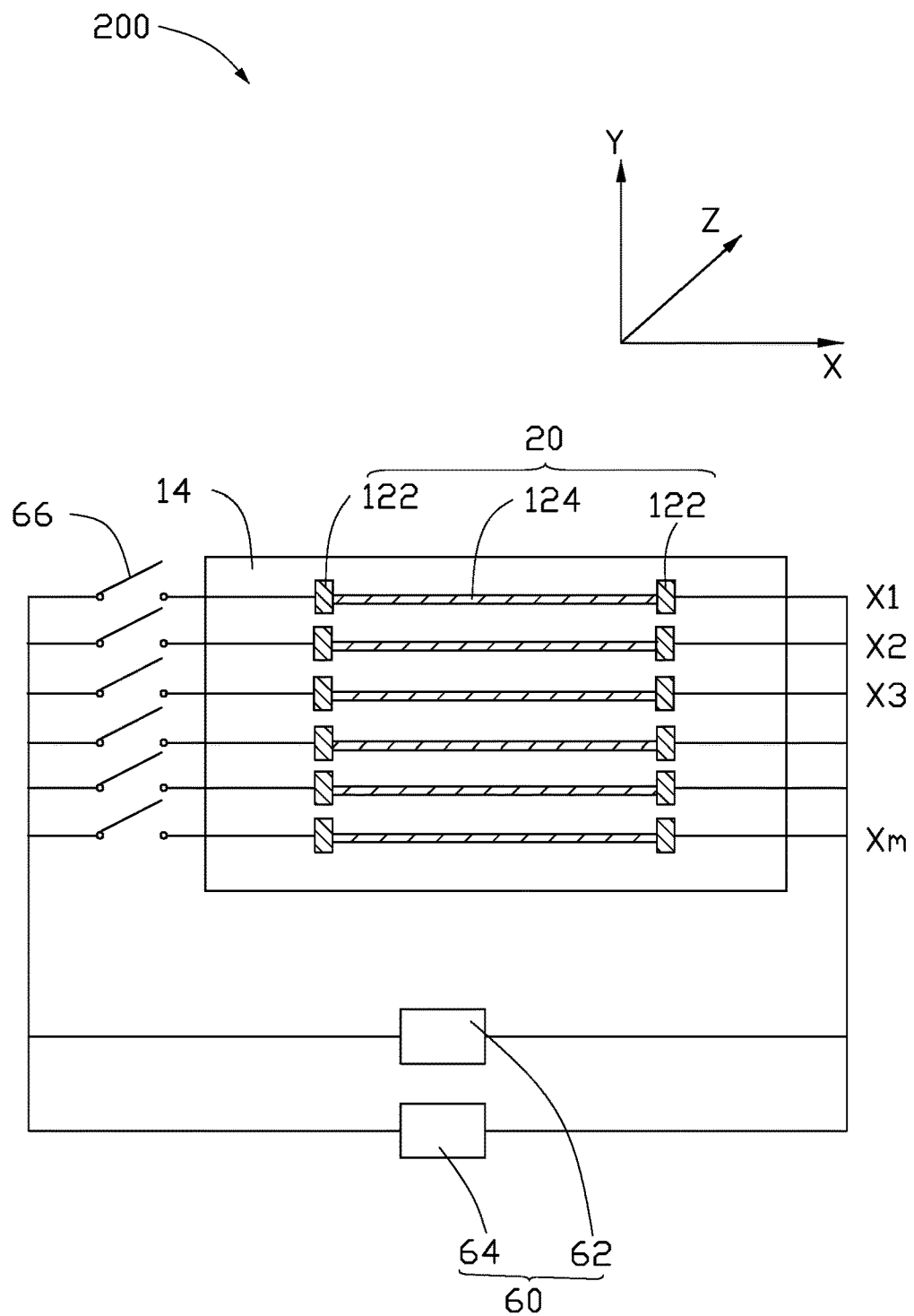
FIG. 6 is a schematic view of one embodiment of an electrostatic sensing device.

Referring to FIG. 6, an electrostatic sensing device 200 according to one embodiment comprises an electrostatic sensing module 20 and a control unit 60 electrically connected to the electrostatic sensing module 20.

The electrostatic sensing module 20 comprises a substrate 14, a plurality of first electrostatic sensing elements 124, and a plurality of first electrodes 122. The plurality of first electrostatic sensing elements 124 and the plurality of first electrodes 122 are located on a surface of the substrate 14. The plurality of first electrostatic sensing elements 124 is spaced and substantially parallel to each other in same interval on a same plane. Each two first electrodes 122 of the plurality of first electrodes 122 are according to one first electrostatic sensing element 124 of the plurality of first electrostatic sensing elements 124. Each two first electrodes 122 of the plurality of first electrodes 122 are separately located on and electrically connected to two opposite sides of one of the plurality of first electrostatic sensing elements 124.

In FIGS. 6-9, a first direction X and a second direction Y, perpendicular to the first direction X, are defined in the surface of the substrate 14. A third direction Z, perpendicular to the surface of the substrate 14, is also defined and shown in FIGS. 6-9. The third direction Z is perpendicular to a plane defined by the first direction X and the second direction Y. The X, Y, Z define a coordination system. In FIG. 5 according to one embodiment, the plurality of first electrostatic sensing elements 124 extends along the first direction X, and is arranged along the second direction Y with same interval. A distance between two adjacent first electrostatic sensing elements 124 can be selected according to resolution ratio. The distance between two adjacent first electrostatic sensing elements 124 can be in a range from about 2 millimeters to about 2 centimeters. In one embodiment, the distance between two adjacent first electrostatic sensing elements 124 is about 3 millimeters. The X, Y, Z define a coordination system in 3 dimensional.

The plurality of first electrostatic sensing elements 124 are labeled by $X_m$ according to an arranging order of the plurality of first electrostatic sensing elements 124. The m is a positive integer. The plurality of first electrostatic sensing elements 124 are electrically connected to the control unit 60 by conductive wires. Thus, when the direct voltage is applied to the plurality of first electrostatic sensing elements 124, the currents of the plurality of first electrostatic sensing elements 124 are detected. When the sensed object is near but not touching the plurality of first electrostatic sensing elements 124, the current/resistance change can also be detected.

The control unit 60 is configured to apply a direct voltage to each of the plurality of first electrostatic sensing elements 124 and measure a current/resistance of each of the plurality of first electrostatic sensing elements 124. The control unit 60 comprises a circuit control module 62, a resistance measuring module 64 and a plurality of switches 66. It is understood that, the number of the switches 66 is same as number of the first electrostatic sensing element 124.

Each one of the plurality of first electrostatic sensing elements 124 is connected to one switch 66 connected to the control unit 60. The circuit control module 62 can apply direct voltage to each one of the plurality of first electrostatic sensing elements 124. The resistance measuring module 64 can measure the current/resistance of each one of the plurality of first electrostatic sensing elements 124.

The electrostatic sensing device 200 can be used to sense a location of the sensed object along the second direction Y when the sensed object is near but does not touch the electrostatic sensing module 20. A method of sensing electrostatic using the electrostatic sensing device 200, comprises steps of:

S10, providing the electrostatic sensing device 200;

S20, applying a direct voltage to the plurality of first electrostatic sensing elements 124; and S30, measuring the resistance changed values of the plurality of first electrostatic sensing elements 124 in response to the sensed object, with electrostatic charge, being near but not making contact with the plurality of first electrostatic sensing elements 124, wherein a distance between the sensed object and the plurality of first electrostatic sensing elements 124 is less than 0.5 centimeter.

In step S30, when the sensed object with electrostatic charge is moved to the electrostatic sensing module 20 in a distance near but not touching the plurality of first electrostatic sensing elements 124, the resistance changed values of the plurality of first electrostatic sensing elements 124 can be measured by the resistance measuring module 64.

The resistance changed values of the plurality of first electrostatic sensing elements 124 are defined as RXm. Therefore, m resistance changed values can be obtained, such as $RX_1$, $RX_2$, $RX_3$, . . . , RXm.

The resistance changed value of the first electrostatic sensing element 124 that is closest to the sensed object is the largest. The location of the first electrostatic sensing element 124 that is closest to the sensed object can be known according to the largest resistance changed value of first electrostatic sensing element 124. Thus, the position of the sensed object in the second direction Y can be known, and Y coordinate of the sensed object can be known.

The electrostatic sensing device 200 can distinguish the moving of touch pen or gesture. The moving of touch pen or gesture can achieve transmission of instruction, and accordingly, achieve operation of electrical device including the electrostatic sensing device 200. The electrical device can be display or switch. A Z direction of position of the sensed object can be determined by analyzing signal strength.

According to the resistance changed value of the first electrostatic sensing element 124 when the sensed object nears but does not touch the first electrostatic sensing element 124, the distance along Z between the sensed object and the first electrostatic sensing element 124 can be measured. In the application, a threshold value of the resistance changed value can be set. The threshold value of the resistance changed value is proportional to a setting threshold distance between the sensed object and the first electrostatic sensing element 124. Therefore, when the sensed object is moved to a place to the first electrostatic sensing element 124 to meet the setting threshold distance, the electrostatic sensing device 200 would send a signal which enables a function of switches. Further, the threshold value of the resistance changed value can be used to control the impact of noise, such as static interference outside. Only when the resistance changed value of the first electrostatic sensing element 124 reaches the threshold value, the electrostatic sensing device 200 will send a signal to achieve function.

The electrostatic sensing device 200 could distinguish gesture by steps of:

S110, providing the electrostatic sensing device 200;

S120, applying a direct voltage to the plurality of first electrostatic sensing elements 124; and S130, measuring the resistance changed values of the plurality of first electrostatic sensing elements 124 in response to the sensed object, with electrostatic charge, moving to the plurality of first electrostatic sensing elements 124 along the second direction Y, wherein a distance between the sensed object and the plurality of first electrostatic sensing elements 124 is less than 0.5 centimeter.

In step S130, the moving tracks or direction of the sensed object can be measured by the locations of the first electrostatic sensing elements 124 with the largest resistance changed values. The sensed objection is moved from the first electrostatic sensing elements 124 with the first largest resistance changed value to the first electrostatic sensing elements 124 with the last largest resistance changed value.

It is understood that the electrostatic sensing device 200 can further comprise the insulating protecting layer 80 shown in FIG. 5 to protect the electrostatic sensing module 20.

Figure 7:
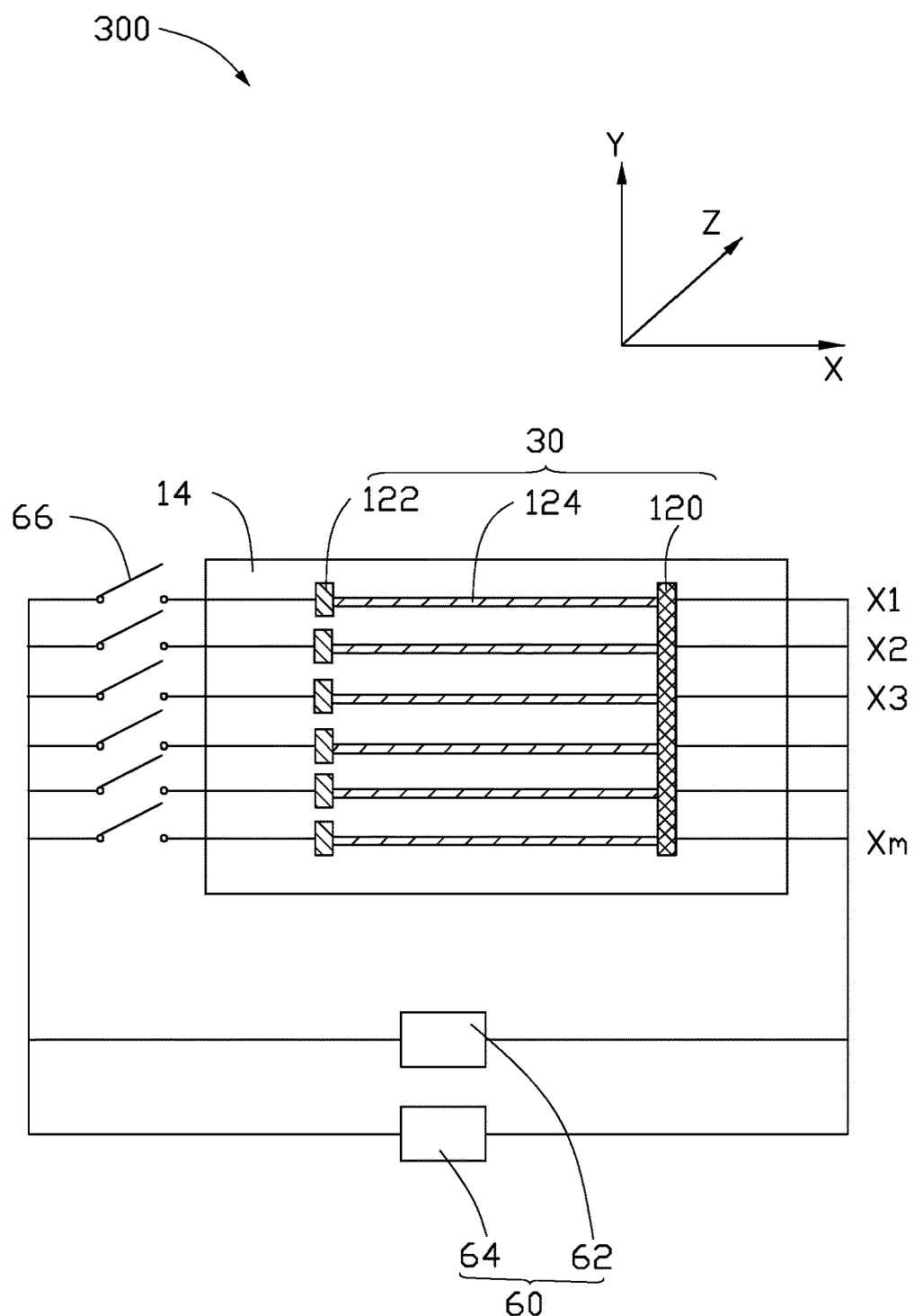
FIG. 7 is a schematic view of one embodiment of an electrostatic sensing device.

Referring to FIG. 7, an electrostatic sensing device 300 according to one embodiment includes an electrostatic sensing module 30 and a control unit 60 electrically connected to the electrostatic sensing module 30. The electrostatic sensing device 300 has same function as the electrostatic sensing device 200. The electrodes connection of the electrostatic sensing device 300 is different to the electrostatic sensing device 200.

The electrostatic sensing module 30 comprises a substrate 14, a plurality of first electrostatic sensing elements 124, a plurality of first electrodes 122 and a third electrode 120. The plurality of first electrostatic sensing elements 124, the plurality of first electrodes 122 and the third electrode 120 are located on a surface of the substrate 14. The plurality of first electrostatic sensing elements 124 is spaced and substantially parallel to each other with same interval. Each of the first electrostatic sensing elements 124 has two opposite ends. One end of each of the plurality of first electrostatic sensing elements 124 is electrically connected to one of the plurality of first electrodes 122. Another end of each of the plurality of first electrostatic sensing elements 124 is electrically connected together to the third electrodes 120. The plurality of first electrostatic sensing elements 124 extends along the first direction X. The third electrode 120 extends along the second direction Y. The third electrode 120 is made of same material as the plurality of first electrodes 122.

Each one of the plurality of first electrostatic sensing elements 124 is connected to one switch 66 connected to the control unit 60. The circuit control module 62 can apply a direct voltage to each one of the plurality of first electrostatic sensing elements 124 simultaneously or in sequence. The resistance measuring module 64 can measure the current/resistance of each one of the plurality of first electrostatic sensing elements 124. The electrostatic sensing device 300 has a same function as the electrostatic sensing device 200.

Figure 8:
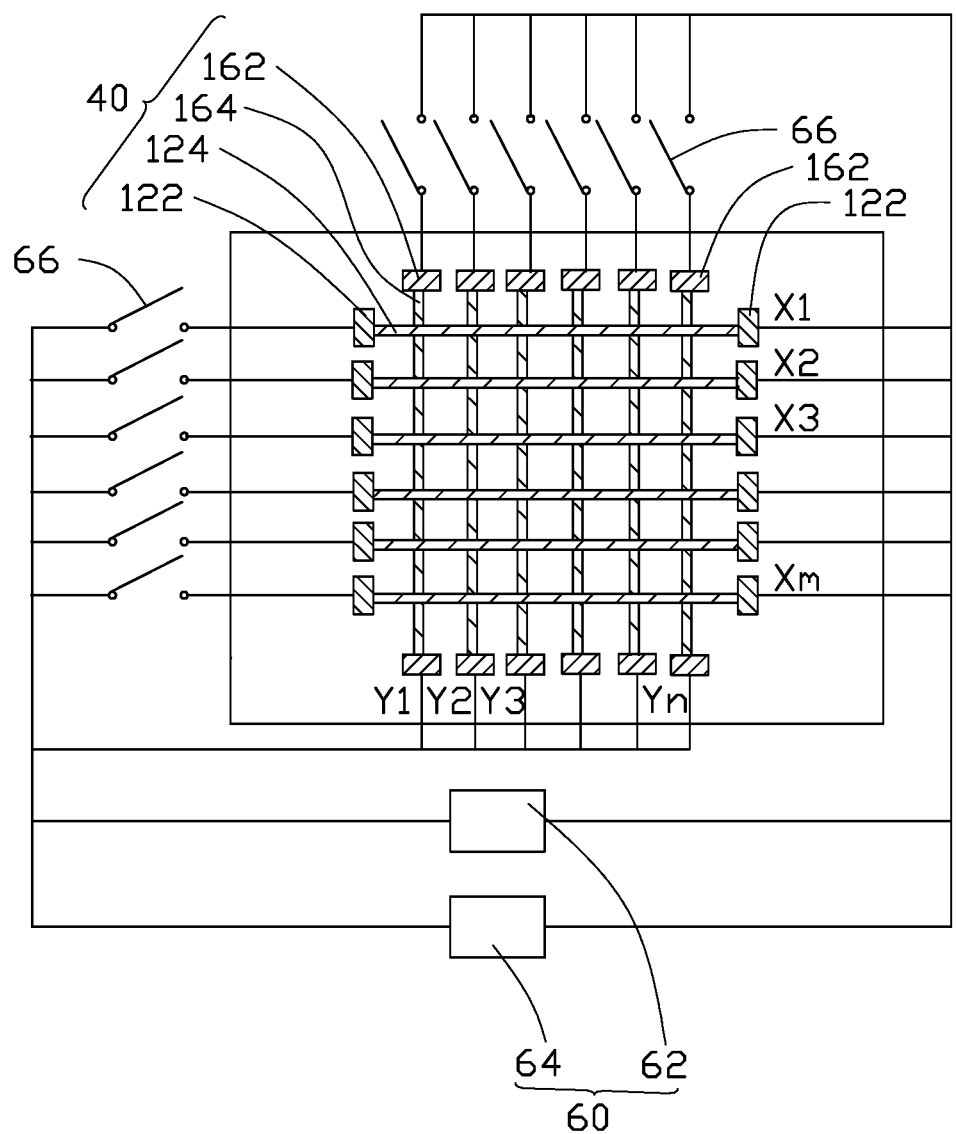
FIG. 8 is a schematic view of one embodiment of an electrostatic sensing device.

Referring to FIG. 8, an electrostatic sensing device 400 according to one embodiment comprises an electrostatic sensing module 40 and a control unit 60 electrically connected to the electrostatic sensing module 40.

The electrostatic sensing module 40 comprises a substrate 14, a plurality of first electrostatic sensing elements 124, a plurality of second electrostatic sensing elements 164, a plurality of first electrodes 122, and a plurality of second electrodes 162. The plurality of first electrostatic sensing elements 124, the plurality of second electrostatic sensing elements 164, the plurality of first electrodes 122, and the plurality of second electrodes 162 are located on a surface of the substrate 14. The plurality of first electrostatic sensing elements 124 and the plurality of second electrostatic sensing elements 164 are made same materials. The plurality of first electrostatic sensing elements 124 and the plurality of second electrostatic sensing elements 164 are intersected with each other, to form a plurality of grids. The plurality of first electrostatic sensing elements 124 and the plurality of second electrostatic sensing elements 164 are electrically insulated from each other. In one embodiment, the plurality of first electrostatic sensing elements 124 and the plurality of second electrostatic sensing elements 164 are arranged in different planes. Each first electrostatic sensing element 124 has a first end and a second end opposite to the first end. The first end is electrically connected to one first electrode 122, and the second end is electrically connected to another one first electrode 122. Each second electrostatic sensing element 164 has a third end and a forth end opposite to the third end. The third end is electrically connected to one second electrode 162, and the forth end is electrically connected to another one second electrode 162.

The plurality of first electrostatic sensing elements 124 extends along the first direction X. The plurality of first electrostatic sensing elements 124 is spaced from each other with same interval and substantially parallel to each other. The plurality of second electrostatic sensing elements 164 extends along the second direction Y. The plurality of second electrostatic sensing elements 164 is spaced from each other with same interval and substantially parallel to each other. The plurality of first electrostatic sensing elements 124 can be located on the surface of the substrate 14, and the plurality of second electrostatic sensing elements 164 can be located on the plurality of first electrostatic sensing elements 124. A distance between two adjacent first electrostatic sensing elements 124 and a distance between two adjacent second electrostatic sensing elements 164 can be selected according to resolution ratio. A distance between two adjacent first electrostatic sensing elements 124 and a distance between two adjacent second electrostatic sensing elements 164 can be in a range from about 2 millimeters to about 2 centimeters.

The plurality of first electrostatic sensing elements 124 and the plurality of second electrostatic sensing elements 164 can be adhered on the surface of the substrate 14 by an insulating adhesive. The insulating adhesive can be located on whole surface of the plurality of first electrostatic sensing elements 124, and the plurality of second electrostatic sensing elements 164 can be located on the insulating adhesive. The insulating adhesive can only be located on portions of the plurality of first electrostatic sensing elements 124 intersected with the plurality of second electrostatic sensing elements 164. In one embodiment, the insulating adhesive is only located on the portions of the plurality of first electrostatic sensing elements 124 intersected with the plurality of second electrostatic sensing elements 164.

The plurality of first electrodes 122 and the plurality of second electrodes 162 can be made of a conductive material, such as metal, conductive polymer, conductive adhesive, metallic carbon nanotubes, or indium tin oxide (ITO). The plurality of first electrodes 122 and the plurality of second electrodes 162 can be made by a method such as screen printing, chemical vapor deposition, or magnetron sputtering. In one embodiment, the material of the plurality of first electrodes 122 and the plurality of second electrodes 162 is ITO.

The control unit 60 comprises a circuit control module 62, a resistance measuring module 64, and a plurality of switches 66. The control unit 60 can be electrically connected to the plurality of first electrodes 122 and the plurality of second electrodes 162 by conductive wire, in order to electrically connect the control unit 60 to the electrostatic sensing module 40. Each of the plurality of second electrostatic sensing elements 164 is electrically connected to one switch 66. Each of the plurality of first electrostatic sensing elements 124 is electrically connected to one switch 66.

The circuit control module 62 can be electrically connected to the resistance measuring module 64 by conductive wire. A direct voltage can be applied to the plurality of first electrostatic sensing elements 124 and the plurality of second electrostatic sensing elements 164 by the circuit control module 62. The resistance measuring module 64 can detect the currents of the plurality of first electrostatic sensing elements 124 and the plurality of second electrostatic sensing elements 164. Thus, the resistance variations of the plurality of first electrostatic sensing elements 124 and the plurality of second electrostatic sensing elements 164 can be measured.

The plurality of first electrostatic sensing elements 124 are labeled by $X_m$ according to an arranging order of the plurality of first electrostatic sensing elements 124. The m is a positive integer. The plurality of first electrostatic sensing elements 124 are electrically connected to the resistance measuring module 64 by conductive wires. Thus, when the direct voltage is applied to the plurality of first electrostatic sensing elements 124, the currents of the plurality of first electrostatic sensing elements 124 are detected.

The plurality of second electrostatic sensing elements 164 are labeled by $Y_n$ according to an arranging order of the plurality of second electrostatic sensing elements 164. The n is a positive integer. The plurality of second electrostatic sensing elements 164 are electrically connected to the control unit 60 by conductive wires. Thus, when the direct voltage is applied to the plurality of second electrostatic sensing elements 164, the currents of the plurality of second electrostatic sensing elements 164 are detected.

The direct voltages can be simultaneously applied by the circuit control element 440, when the sensed object nears but not touch the surface of the substrate 14, currents of the plurality of first electrostatic sensing elements 124 and the plurality of second electrostatic sensing elements 164 will change because of influence of band gap structure in the single walled carbon nanotube or the few-walled carbon nanotube as explained before. The resistance measuring module 64 can detect the current changes of the plurality of first electrostatic sensing elements 124 along the second direction Y and the first direction X. The resistance measuring module 64 can detect the current changes of the plurality of second electrostatic sensing elements 164 along the second direction Y and the first direction X.

The resistance changed values of the plurality of first electrostatic sensing elements 124 are defined as RXm. Therefore, m resistance changed values can be obtained, such as $RX_1, RX_2, RIX_3, \ldots, RXm$. The resistance changed values of the plurality of second electrostatic sensing elements 164 are defined as RYn. Thus, n resistance changed values can be obtained, such as $RY_1, RY_2, RY_3, \ldots, RYn$.

The resistance changed value of the first electrostatic sensing element 124 closest to the sensed object is the largest. The first electrostatic sensing element 124 closest to the sensed object can be known according to the largest resistance changed value of first electrostatic sensing element 124. Thus, the distance between the sensed object and the first electrostatic sensing element 124 closest to the sensed object can be known, and accordingly, the position of the sensed object in the second direction Y can be known, and Y coordinate of the sensed object can be known.

The resistance changed value of the second electrostatic sensing element 164 closest to the sensed object is the largest. The second electrostatic sensing element 164 closest to the sensed object can be known according to the largest resistance changed value of second electrostatic sensing element 164. Thus, the distance between the sensed object and the second electrostatic sensing element 164 closest to the sensed object can be known, and accordingly, the position of the sensed object in the second direction X can be known, and X coordinate of the sensed object can be known. The position of the sensed object can be obtained according to Y coordinate and X coordinate of the sensed object. An electrical device comprises the electrostatic sensing device 400 can be controlled by the position coordinates of the sensed object, after determining the position coordinates of the sensed object.

The electrostatic sensing device 400 can distinguish the moving of touch pen or gesture. The moving of touch pen or gesture can achieve transmission of instruction, and accordingly, achieve operation of electrical device including the electrostatic sensing device 400. The electrical device can be display or switch. Multi-touch control and multi-hover control can be achieved by adjusting driving mode and computational method. A Z direction of position of the sensed object can be determined by analyzing signal strength.

A method for detecting the sensed object of the electrostatic sensing device 400 comprises steps of:

S100, providing the electrostatic sensing device 400;

S200, applying a direct voltage to the plurality of first electrostatic sensing elements 124, and the plurality of second electrostatic sensing elements 164; and S400, measuring the resistance changed values of the plurality of first electrostatic sensing elements 124 and the plurality of second electrostatic sensing elements 164 in response to the sensed object, with electrostatic charge, being near but not making contact with the plurality of first electrostatic sensing elements 124 and the plurality of second electrostatic sensing elements 164, wherein a distance between the sensed object and the plurality of first electrostatic sensing elements 124 and the plurality of second electrostatic sensing elements 164 is less than 0.5 centimeter.

In step S200, the direct voltage can be applied to the plurality of first electrostatic sensing elements 124 and the plurality of second electrostatic sensing elements 164 simultaneously. The direct voltage can also be applied to the plurality of first electrostatic sensing elements 124 in sequence. The direct voltage can also be applied to the plurality of second electrostatic sensing elements 164 in sequence.

Figure 9:
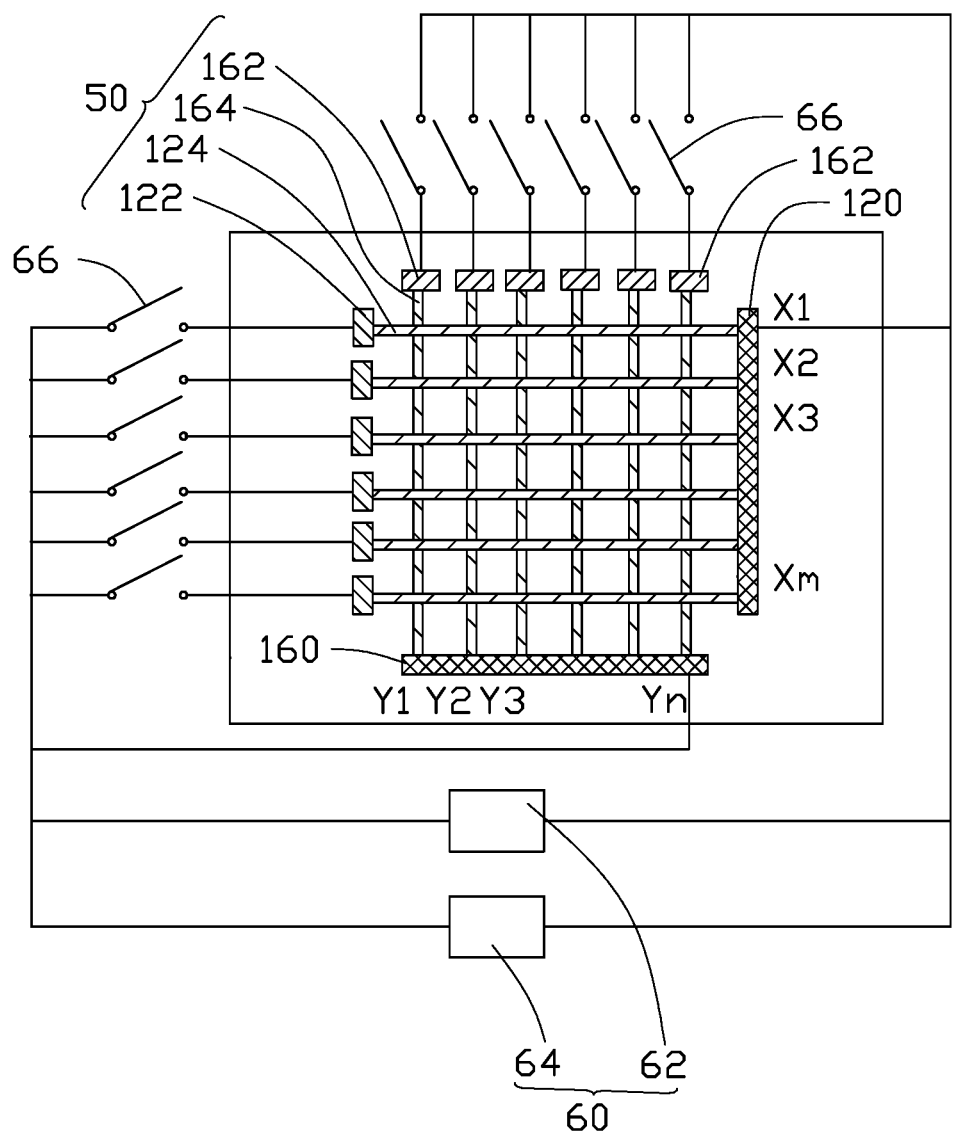
FIG. 9 is a schematic view of one embodiment of an electrostatic sensing device.

Referring to FIG. 9, an electrostatic sensing device 500 according to one embodiment comprises an electrostatic sensing module 50 and a control unit 60 electrically connected to the electrostatic sensing module 50. The electrostatic sensing device 500 almost has same structure and function as the electrostatic sensing device 400, except the electrodes locations.

The electrostatic sensing module 50 comprises a substrate 14, a plurality of first electrostatic sensing elements 124, a plurality of second electrostatic sensing elements 164, a plurality of first electrodes 122, a plurality of second electrodes 162, a third electrode 120 and a forth electrode 160. The plurality of first electrostatic sensing elements 124, the plurality of second electrostatic sensing elements 164, the plurality of first electrodes 122, the plurality of second electrodes 162, the third electrode 120 and the forth electrode 16 are located on a surface of the substrate 14. The third electrode 120 and the forth electrode 160 are made of same material. The plurality of first electrostatic sensing elements 124 and the plurality of second electrostatic sensing elements 164 are intersected with each other, to form a plurality of grids. The plurality of first electrostatic sensing elements 124 and the plurality of second electrostatic sensing elements 164 are electrically insulated from each other. In one embodiment, the plurality of first electrostatic sensing elements 124 and the plurality of second electrostatic sensing elements 164 are arranged in different planes. Each first electrostatic sensing element 124 has a first end and a second end opposite to the first end. The first end is electrically connected to one first electrode 122, and the second ends of the plurality of first electrostatic sensing elements 124 are electrically connected together to the third electrode 120. Each second electrostatic sensing element 164 has a third end and a forth end opposite to the third end. The third end is electrically connected to one second electrode 162, and the forth ends of the plurality of second electrostatic sensing elements 164 are electrically connected together to the forth electrode 160.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may include some indication in reference to certain steps. However, the indication used is only to be viewed for identification purposes and not as a suggestion as to an order for the steps.

What is claimed is:

1. An electrostatic sensing device, comprising:
an electrostatic sensing module comprising two first electrodes being metal electrodes and a first electrostatic sensing element, wherein a material of each metal electrode is metal, the two first electrodes are separately located on and electrically connected to two opposite ends of the first electrostatic sensing element, the first electrostatic sensing element has a first end and a second end opposite to the first end, one of the two first electrodes is in direct contact with the first end, and the another one of the two first electrodes is in direct contact with the second end; the first electrostatic sensing element is one one-dimensional semiconducting linear structure, and an absolute value of $(d\sigma/dE_F)/(\sigma/E_F)$ of the one-dimensional semiconducting linear structure is greater than $10^{-1}$, $\sigma$ is the conductivity of the one-dimensional semiconducting linear structure, $E_F$ is Fermi surface location of the one-dimensional semiconducting linear structure; and the one-dimensional semiconducting linear structure is a single walled carbon nanotube with a length of greater than 1 centimeter, and a diameter of less than 5 nanometers; and
a control unit electrically connected to the electrostatic sensing module, wherein the control unit electrically is configured to apply a direct voltage to the first electrostatic sensing element and measure a current/resistance of the first electrostatic sensing element when a sensed object with an electrostatic charge is near but does not touch the first electrostatic sensing element.

2. The electrostatic sensing device as claimed in claim 1, further comprising a substrate to support the electrostatic sensing module, wherein the first electrostatic sensing element and the two first electrodes are located on a surface of the substrate.

3. The electrostatic sensing device as claimed in claim 2, wherein the control unit comprises a circuit control module, a resistance measuring module and a switch, and the circuit control module, and the resistance measuring module and the switch are electrically connected to the two first electrodes.

4. The electrostatic sensing device as claimed in claim 3, wherein the circuit control module is configured to apply the direct voltage to the first electrostatic sensing element.

5. The electrostatic sensing device as claimed in claim 3, wherein the resistance measuring module is configured to measure the current/resistance of the first electrostatic sensing element.

6. The electrostatic sensing device as claimed in claim 2, further comprising an insulating protecting layer located on the substrate to protect the electrostatic sensing module, wherein the first electrostatic sensing element and the two first electrodes are covered by the insulating protecting layer.

7. An electrostatic sensing device, comprising:
an electrostatic sensing module comprising a plurality of first electrostatic sensing elements spaced and substantially parallel to each other with a same interval along a first direction, a plurality of second electrostatic sensing elements spaced and substantially parallel to each other in same interval along a second direction perpendicular to the first direction, a plurality of first electrodes being metal electrodes and a plurality of second electrodes being metal electrodes; wherein a material of each metal electrode is metal, each two first electrodes of the plurality of first electrodes are separately located on and electrically connected to two opposite sides of one of the plurality of first electrostatic sensing elements, each two second electrodes of the plurality of second electrodes are separately located on and electrically connected to two opposite sides of one of the plurality of second electrostatic sensing elements, the plurality of first electrostatic sensing elements is intersected with the plurality of second electrostatic sensing elements; each of the plurality of first electrostatic sensing elements has a first end and a second end opposite to the first end, one of the plurality of first electrodes is in direct contact with the first end, and another one of the plurality of first electrodes is in direct contact with the second end; and each of the plurality of second electrostatic sensing elements has a third end and a fourth end opposite to the third end, one of the plurality of second electrodes is in direct contact with the third end, and another one of the plurality of second electrodes is in direct contact with the fourth end; each of the plurality of first electrostatic sensing elements and each of the plurality of second electrostatic sensing elements are one one-dimensional semiconducting linear structure with a diameter of less than 100 nanometers, and an absolute value of $(d\sigma/dE_F)/(\sigma/E_F)$ of the one-dimensional semiconducting linear structure is greater than $10^{-1}$, $\sigma$ is the conductivity of the one-dimensional semiconducting linear structure, $E_F$ is Fermi surface location of the one-dimensional semiconducting linear structure; and the one-dimensional semiconducting linear structure is a single walled carbon nanotube with a length of greater than 1 centimeter, and a diameter of less than 5 nanometers; and a control unit electrically connected to the electrostatic sensing module, wherein the control unit electrically is configured to apply a direct voltage to the plurality of first electrostatic sensing elements and the plurality of second electrostatic sensing elements and measure a current/resistance of the plurality of first electrostatic sensing elements and the plurality of second electrostatic sensing elements when a sensed object with electrostatic charge near but does not touch the plurality of first electrostatic sensing elements and the plurality of second electrostatic sensing elements.

8. The electrostatic sensing device as claimed in claim 7, further comprising a substrate to support the electrostatic sensing module, wherein the plurality of first electrostatic sensing elements, the plurality of first electrostatic sensing elements, the plurality of first electrodes and the plurality of second electrodes are located on a surface of the substrate.

9. The electrostatic sensing device as claimed in claim 7, wherein the control unit comprises a circuit control module configured to apply the direct voltage to the plurality of first electrostatic sensing elements and the plurality of second electrostatic sensing elements, and a resistance measuring module configured to measure the current/resistance of the plurality of first electrostatic sensing elements and the plurality of second electrostatic sensing elements.

10. The electrostatic sensing device as claimed in claim 7, wherein the one-dimensional semiconducting linear structure is a single walled carbon nanotube, few-walled carbon nanotube, semiconducting graphene strip, or semiconducting silicon nanowire.

* * * * *